(12) United States Patent
Liu

(10) Patent No.: US 8,691,600 B2
(45) Date of Patent: Apr. 8, 2014

(54) METHOD FOR TESTING THROUGH-SILICON-VIA (TSV) STRUCTURES

(75) Inventor: Hung-Ming Liu, Hsinchu County (TW)

(73) Assignee: United Microelectronics Corp., Science-Based Insustrial Park, Hsin-Chu (TW)

( * ) Notice: Subject to any disclaimer, the term of this patent is extended or adjusted under 35 U.S.C. 154(b) by 0 days.

(21) Appl. No.: 13/461,795

(22) Filed: May 2, 2012

(65) Prior Publication Data

US 2013/0295699 A1 Nov. 7, 2013

(51) Int. Cl.
*H01L 21/66* (2006.01)

(52) U.S. Cl.
USPC .................... 438/17; 438/14; 324/719

(58) Field of Classification Search
USPC ............................ 438/17; 324/719
See application file for complete search history.

(56) References Cited

U.S. PATENT DOCUMENTS

| | | | |
|---|---|---|---|
| 3,150,299 A | 9/1964 | Noyce | |
| 3,256,465 A | 6/1966 | Weissenstem | |
| 3,323,198 A | 6/1967 | Shortes | |
| 3,343,256 A | 9/1967 | Smith | |
| 3,372,070 A | 3/1968 | Zuk | |
| 3,462,650 A | 8/1969 | Hennings | |
| 3,648,131 A | 3/1972 | Stuby | |
| 4,394,712 A | 7/1983 | Anthony | |
| 4,395,302 A | 7/1983 | Courduvelis | |
| 4,616,247 A | 10/1986 | Chang | |
| 4,773,972 A | 9/1988 | Mikkor | |
| 4,939,568 A | 7/1990 | Kato | |
| 5,214,000 A | 5/1993 | Chazan | |
| 5,229,647 A | 7/1993 | Gnadinger | |
| 5,286,926 A | 2/1994 | Kimura | |
| 5,372,969 A | 12/1994 | Moslehi | |
| 5,399,898 A | 3/1995 | Rostoker | |
| 5,463,246 A | 10/1995 | Matsunami | |
| 5,484,073 A | 1/1996 | Erickson | |
| 5,502,333 A | 3/1996 | Bertin | |
| 5,627,106 A | 5/1997 | Hsu | |
| 5,793,115 A | 8/1998 | Zavracky | |
| 5,977,640 A | 11/1999 | Bertin | |
| 6,018,196 A | 1/2000 | Noddin | |
| 6,143,616 A | 11/2000 | Geusic | |
| 6,274,937 B1 | 8/2001 | Ahn | |
| 6,309,956 B1 | 10/2001 | Chiang | |
| 6,391,777 B1 | 5/2002 | Chen | |
| 6,407,002 B1 | 6/2002 | Lin | |
| 6,440,640 B1 | 8/2002 | Yang | |
| 6,483,147 B1 | 11/2002 | Lin | |
| 6,525,419 B1 | 2/2003 | Deeter | |
| 6,548,891 B2 | 4/2003 | Mashino | |
| 6,551,857 B2 | 4/2003 | Leedy | |
| 6,627,985 B2 | 9/2003 | Huppenthal | |
| 6,633,083 B2 | 10/2003 | Woo | |
| 6,746,936 B1 | 6/2004 | Lee | |

(Continued)

*Primary Examiner* — Charles Garber
*Assistant Examiner* — Brigitte Paterson
(74) *Attorney, Agent, or Firm* — Winston Hsu; Scott Margo

(57) ABSTRACT

A method for testing TSV structures includes providing a wafer having a front side and a back side, the wafer further comprising a plurality of TSV structures formed therein; thinning the wafer from the back side of the wafer; forming a first under bump metallization layer on the back side of the wafer blanketly; providing a probing card to the front side of the wafer to test the TSV structures; and patterning the first UBM layer.

10 Claims, 5 Drawing Sheets

(56) References Cited

U.S. PATENT DOCUMENTS

| | | |
|---|---|---|
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,732,926 B2 | 6/2010 | Uchiyama |
| 7,846,837 B2 | 12/2010 | Kuo |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1 | 6/2010 | Kuo |
| 2010/0140772 A1 | 6/2010 | Lin |
| 2010/0244247 A1 | 9/2010 | Chang |
| 2010/0323478 A1 | 12/2010 | Kuo |
| 2011/0283034 A1* | 11/2011 | Kang et al. .................. 710/305 |
| 2012/0286814 A1* | 11/2012 | Wang et al. ............ 324/754.03 |
| 2013/0120018 A1* | 5/2013 | Hou et al. ............... 324/762.01 |

* cited by examiner

METHOD FOR TESTING THROUGH-SILICON-VIA (TSV) STRUCTURES

BACKGROUND OF THE INVENTION

1. Field of the Invention

The invention relates to a method for testing through-silicon-via (hereinafter abbreviated as TSV) structures, and more particularly, to a method for testing electrical continuity of TSV structures.

2. Description of the Prior Art

With progress in semiconductor manufacturing technology, a multitude of chips may now be integrated into one single package. And in a single package, the connection between chips is realized by TSV structures.

Conventionally, a TSV structure is formed by deep etching into the wafer or the substrate, and filling the resulting hole with a liner and a conductive filling layer. Then, the wafer is thinned from its backside, until the conductive filling layer is exposed, and a backside metal and bumps are deposited on the thinned backside for electrical contact. It is well-known that the TSV structures are not functional before forming the backside metal and the bumps. Therefore, it is extremely difficult to determine whether the TSV structure is defective or not by the conventional inline electrical testing before completing the abovementioned steps. Accordingly, throughput, efficiency, and cost of the semiconductor fabrication process are adversely influenced.

SUMMARY OF THE INVENTION

According to a first aspect of the present invention, a method for testing TSV structures is provided. The method includes providing a wafer having a front side and a back side, the wafer further comprising a plurality of TSV structures formed therein; thinning the wafer from the back side of the wafer; forming a first under bump metallization (hereinafter abbreviated as UBM) layer on the back side of the wafer blanketly; providing a probing card to the front side of the wafer to test the TSV structures; and patterning the first UBM layer.

According to a second aspect of the present invention, a method for testing TSV structures is further provided. The method includes providing a wafer having a front side and a back side, the wafer further comprising a plurality of TSV structures formed therein; thinning the wafer from the back side of the wafer; forming a plurality of patterned conductive layers on the back side of the wafer, wherein at least one of the patterned conductive layers is electrically connected to at least two of the TSV structures; forming a tape on the back side of the wafer to support the wafer; and providing a probing card to the front side of the wafer to test the TSV structures.

According to the methods for testing the TSV structures provided by the present invention, testing for physical and electrical continuity of the TSV structures is carried out by providing the probing card to the TSV structures. More important, the un-patterned first UBM layer or the patterned conductive layers formed on the back side of the wafer serves as a grounding layer during testing the TSV structures, thus the electrical continuity between any two independent TSV structures is detected.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a method for testing TSV structures provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIGS. 6-10 are schematic drawings illustrating a method for testing TSV structures provided by a second preferred embodiment of the present invention, wherein FIG. 7 is a schematic drawing in a step subsequent to FIG. 6, FIG. 8 is a schematic drawing illustrating a modification to the preferred embodiment;

FIG. 9 is a schematic drawing in a step subsequent to FIG. 7, and

FIG. 10 is a schematic drawing in a step subsequent to FIG. 8.

DETAILED DESCRIPTION

Figure 1:
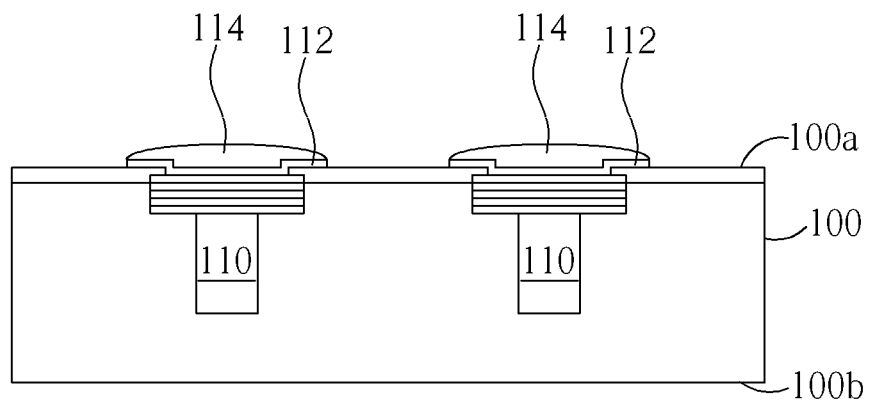

Please refer to FIGS. 1-5, which are schematic drawings illustrating a method for testing TSV structures provided by a first preferred embodiment of the present invention. As shown in FIG. 1, a wafer 100 having a plurality of TSV structures 110 is provided. The wafer 100 further includes a first side 100a and an opposite second side 100b defined thereon. As shown in FIG. 1, the TSV structures 110 are formed and embedded in the wafer 100. A plurality of pad 112 and a plurality of bumps 114 are formed on the first side 100a for providing electrical connection to the TSV structures 110, respectively. In the step, the first side 100a is a front side of the wafer 100 and the second side 100b is a back side of the wafer 100.

Figure 2:
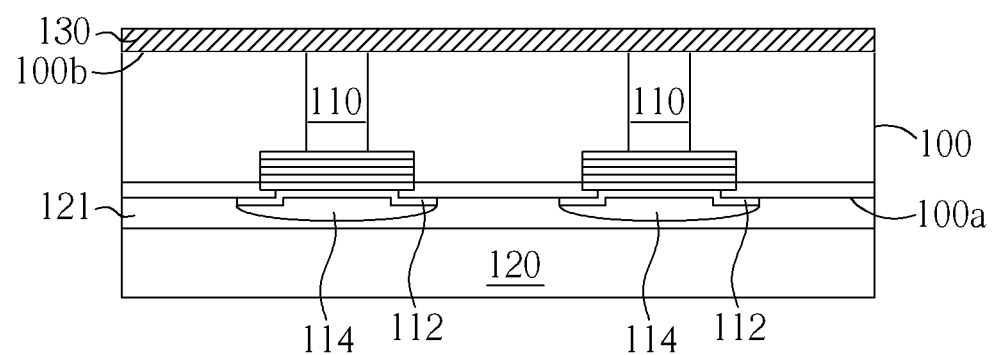

Please refer to FIG. 2. Next, the wafer 100 is flipped over and followed by forming a first carrier wafer 120 on the first side 100a that is the front side of the wafer 100 with an adhesive 121. The first carrier wafer 120 can be, for example but not limited to, a silicon wafer or a glass wafer. After forming the first carrier wafer 120, the wafer 100 is thinned from the second side 100b, that is from the back side 100b, to form a thinned wafer 100. More important, the TSV structures 110 originally embedded in the wafer 100 are now exposed at the second side 100b of the thinned wafer 100. After thinning the wafer 100, a passivation layer (not shown) and a first UBM layer 130 are blanketly formed on the second side 100b, that is the back side, of the thinned wafer 100, sequentially. It is noteworthy that the first UBM layer 130 electrically connects to all of the exposed TSV structures 110 as shown in FIG. 2. The first UBM layer 130 includes conductive materials such as titanium (Ti), titanium-tungsten alloys (TiW), copper (Cu), or aluminum (Al), but not limited to this.

Figure 3:
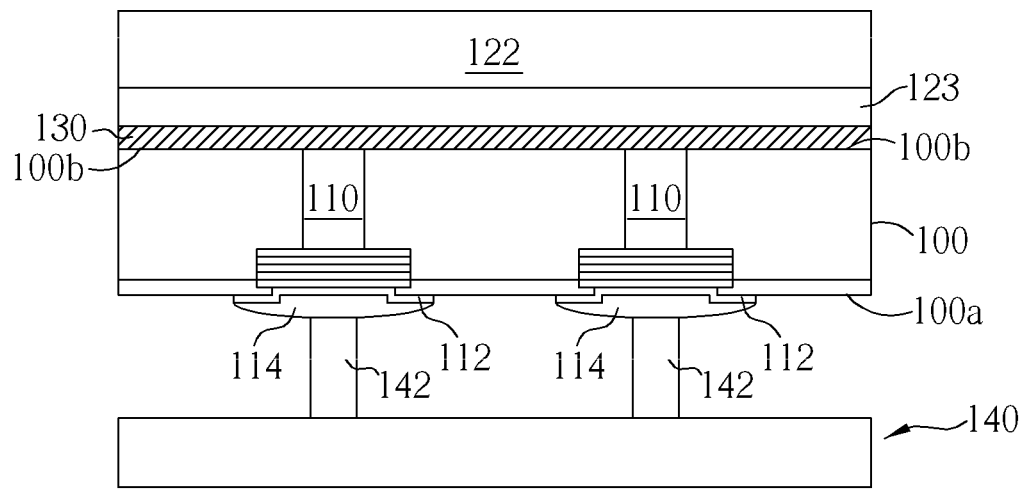

Please refer to FIG. 3. After forming the first UBM layer 130, the wafer 100 is bonded to a second carrier wafer 122 on the second side 100b of the wafer 100 by an adhesive 123. Then, the first carrier wafer 120 is removed from the first side 100a of the wafer 100, and thus the bumps 114 electrically connecting to each TSV structure 110 are exposed. After removing the first carrier wafer 120, a probing card 140 is provided to the front side 100a to test the TSV structures 110. As shown in FIG. 3, probing tips 142 of the probing card 140 respectively contact the bumps 114 for testing the electrical continuity of the TSV structures 110. It is noteworthy that because the first UBM layer 130 electrically connects to all of the TSV structures 110, the first UBM layer 130 serves as a grounding layer for testing physical and electrical continuity between any two individual TSV structures 110.

Figure 4:
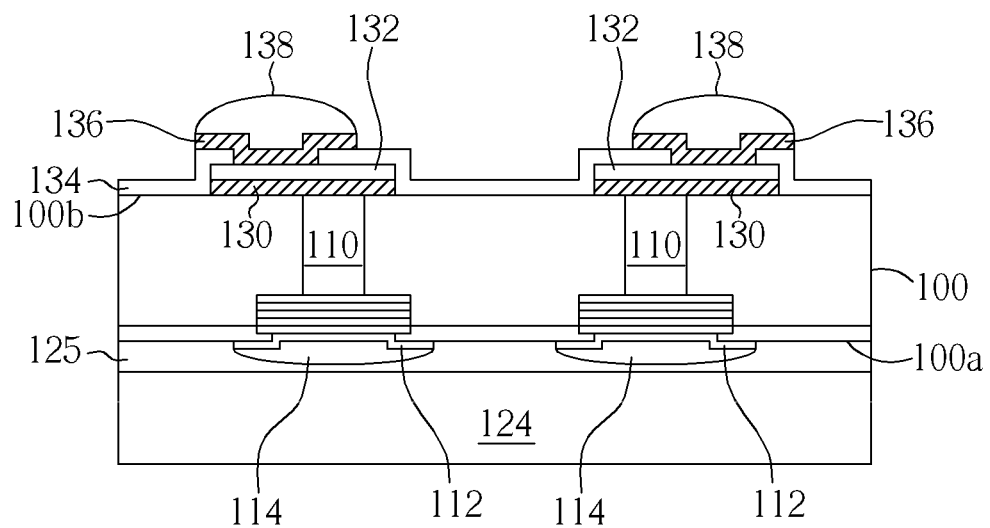

Please refer to FIG. 4. After testing the electrical continuity of the TSV structures 110, a third carrier wafer 124 is formed on the first side 100a of the wafer 100 by an adhesive 125 and followed by removing the second carrier wafer 122. After forming the third carrier wafer 124, a redistribution layer (RDL) 132 is selectively formed on the second side 100b of the wafer 100. Then, the RDL 132 and the first UBM layer 130 are patterned and followed by sequentially forming a patterned passivation layer 134 and a second UBM layer on the patterned RDL 132. The patterned passivation layer 134 exposes the RDL 132. Then the second UBM layer is also patterned to form a plurality of pads 136 corresponding to each RDL 132 and TSV structure 110. Next, a plurality of bumps 138 is formed on each pad 136 as shown in FIG. 4. Thus, the wafer 100 can be electrically connected to other circuit through the bumps 114 formed on the first side 100a and the bumps 138 formed on the second side 100b.

Figure 5:
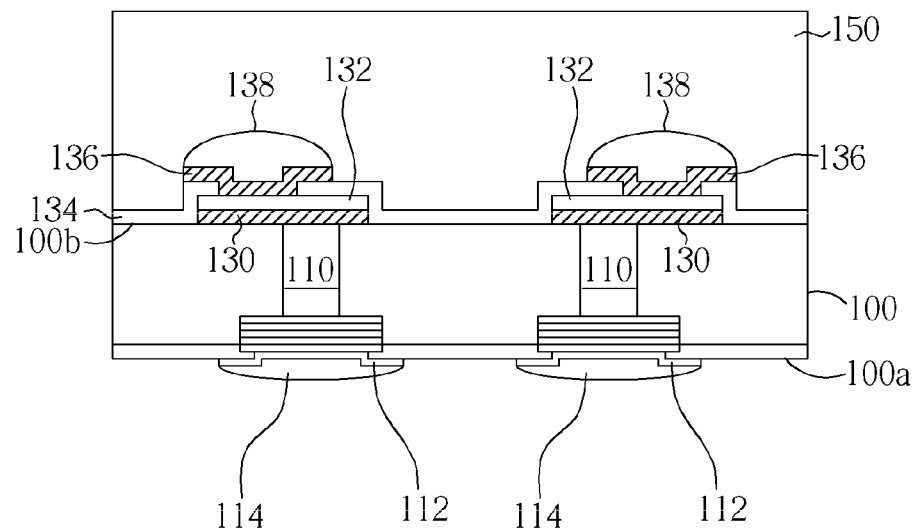

Please refer to FIG. 5. After forming the bumps 138, a tape 150 is formed on the second side 100b of the wafer 100 to support the wafer 100, and then the third carrier wafer 124 is removed. Consequently, the wafer 100 is ready for the following processes with the tape 150 providing support.

According to the first preferred embodiment, the first UBM layer 130 serves as the grounding layer, thus the electrical continuity test can be performed earlier than the state of the art. As mentioned above, the test is performed in advance to forming the bumps 138 on the second side 100b, even to patterning the first UBM layer 130. Since the continuity of the TSV structures 110 is detected earlier than the conventional arts, throughput, efficiency, and cost of the semiconductor fabrication process are all improved.

Figure 6:
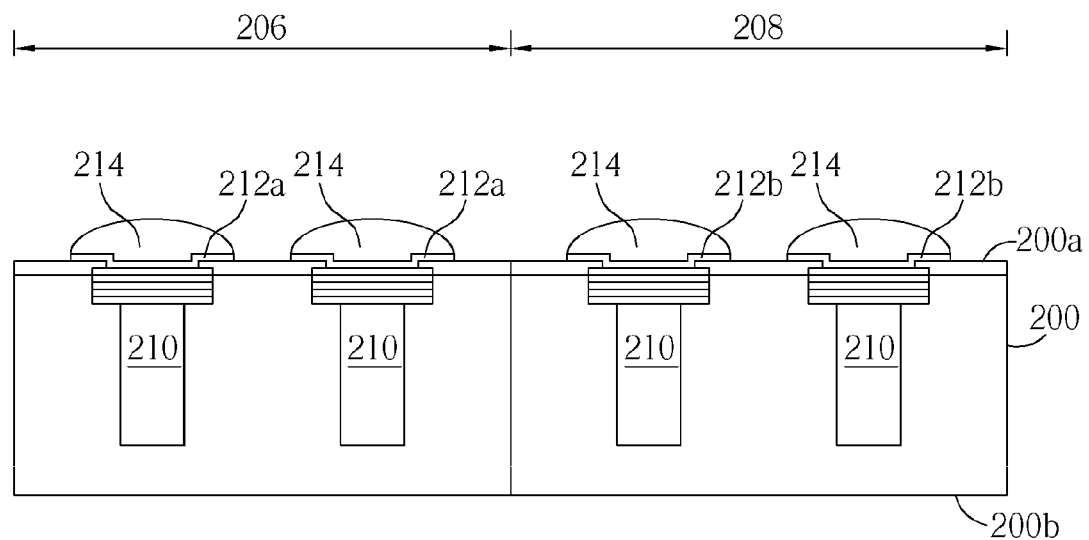

Please refer to FIGS. 6-10, which are schematic drawings illustrating a method for testing TSV structures provided by a second preferred embodiment of the present invention. As shown in FIG. 6, a wafer 200 having a plurality of TSV structures 210 is provided. The wafer 200 further includes a first side 200a and an opposite second side 200b defined thereon. As shown in FIG. 6, the TSV structures 210 are formed and embedded in the wafer 200. A plurality of pad 212a/212b and a plurality of bumps 214 are formed on the first side 200a for providing electrical connection to the TSV structures 210, respectively. Furthermore, the wafer 200 includes at least a function region 206 and a non-function region 208, and the pads 212a/212b respectively formed in the function region 206 and the non-function region 208 are provided for different function. For example, the pads 212a serves as function pads while the pads 212b serve as non-function pads such as grounding pads, dummy pads, or thermal conductive pads, but not limited to this.

Figure 7:
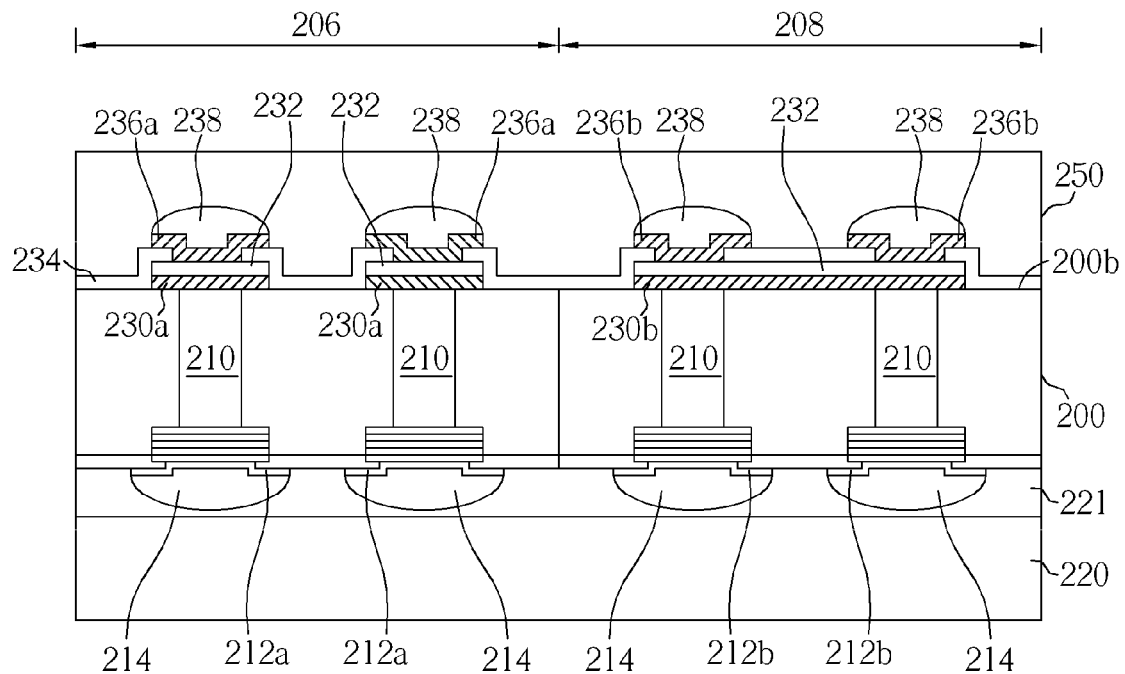

Please refer to FIG. 7. Next, the wafer 200 is flipped over and followed by forming a first carrier wafer 220 on the first side 200a of the wafer 200 with an adhesive 221. The first carrier wafer 220 can be, for example but not limited to, a silicon wafer or a glass wafer. After forming the first carrier wafer 220, the wafer 200 is thinned from the second side 200b, that is from the back side 200b, to form a thinned wafer 200. More important, the TSV structures 210 originally embedded in the wafer 200 are now exposed at the second side 200b of the thinned wafer 200. After thinning the wafer 200, a passivation layer (not shown) and conductive layers such as a first UBM layer (not shown) and a RDL 232 are blanketly formed on the second side 200b, that is the back side, of the wafer 200, sequentially. Then, the RDL 232 and the first UBM layer are patterned to form a plurality of first pads 230a/230b. It is noteworthy that the first pads 230a formed in the function region 206 are corresponding to each TSV structure 210 for providing electrical connection to individual TSV structures 210 in the function region 206, respectively. However, it is noteworthy that since the TSV structures 210 formed in the non-function region 208 are not provided for circuit function, the TSV structures 210 formed in the non-function region 208 are electrically connected to each other by the first pad 230b as shown in FIG. 7. In other words, at least one of the patterned conductive layers, such as the first pads 230b or the RDL 232 is electrically connected to at least two of the TSV structures 210 as shown in FIG. 7. The first pad 230b in the non-functional region 208 can be non-function pad such as dummy pad, thermal pad, or grounding pad. As shown in FIG. 7, the dummy pad 230b, the thermal pad 230b, or the grounding pad 230b are electrically connected.

Please still refer to FIG. 7. After forming the first pads 230a/230b, a patterned passivation layer 234 and a second UBM layer are sequentially formed on the patterned RDL 232. Then the second UBM layer is also patterned to form a plurality of second pads 236a/236b. It is noteworthy that the second pads 236a in the function region 206 are respectively formed corresponding to each TSV structure 210 and the first pads 230a for providing electrical connection to individual TSV structures 210. However, it is noteworthy that the second pads 236b in the non-function region 208 are all electrically connected to each other by the first pad 230b. In other words, the second pads 236b can be formed as one pad that electrically connects to all the TSV structures in the non-functional region 208 while the second pads 236a respectively connect to one of the TSV structures 210. Then, a plurality of bumps 238 are respectively formed on the second pads 236a/236b shown in FIG. 7. As mentioned above, the bumps 238 are formed corresponding to the second pads 236a/236b, thus the wafer 200 can be electrically connected to other circuit through the bumps 214 formed on the first side 200a and the bumps 238 formed on the second side 200b.

Figure 8:
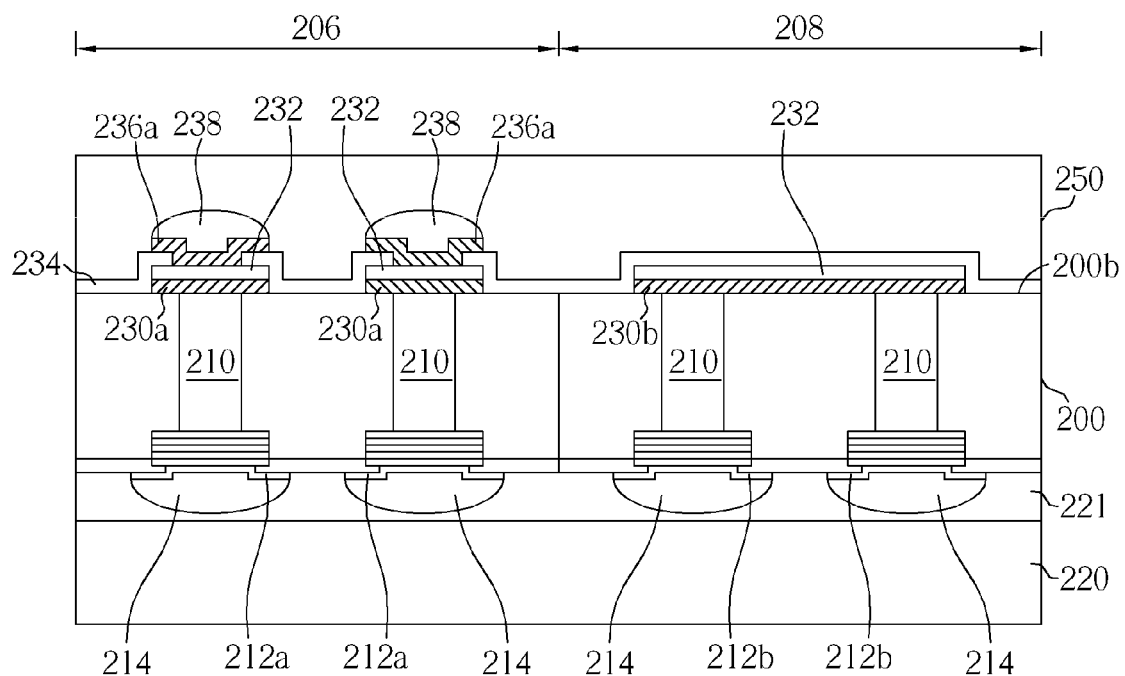

Please refer to FIG. 8, which is a modification to the preferred embodiment. As shown in FIG. 8, the second UBM layer is removed from the first pad 230b in the non-function region 208. In other words, there is no second pad formed in the non-function region 208 and thus no bumps are formed in the non-function region 208. Please still refer to FIGS. 7 and 8. After forming the bumps 238, a tape 250 is formed on the second side 200b of the wafer 200.

Figure 9:
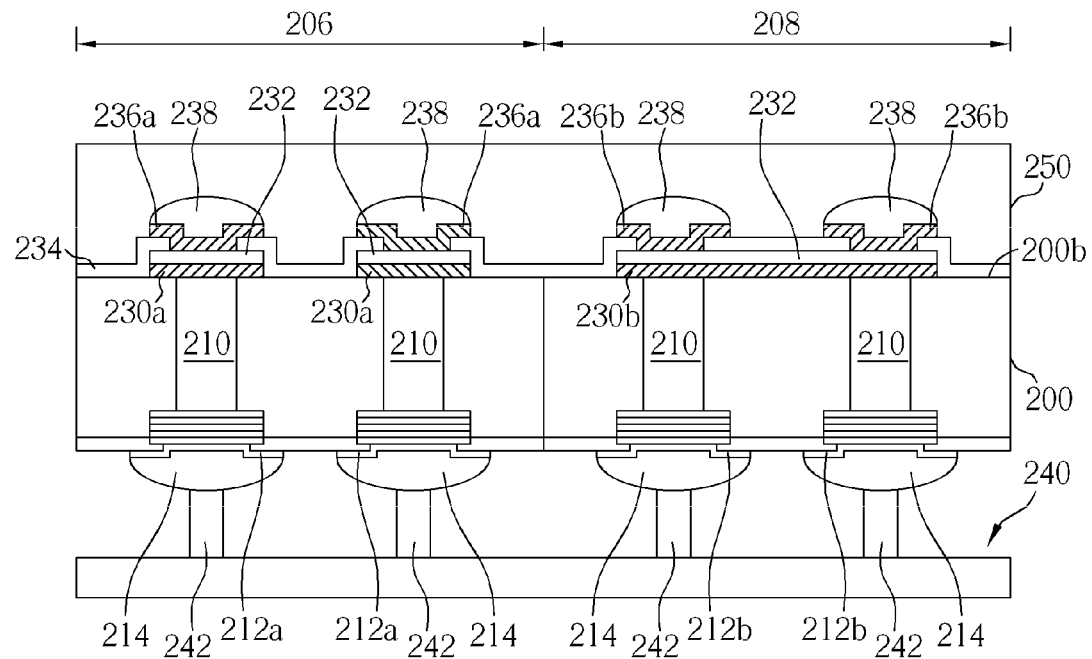
Figure 10:
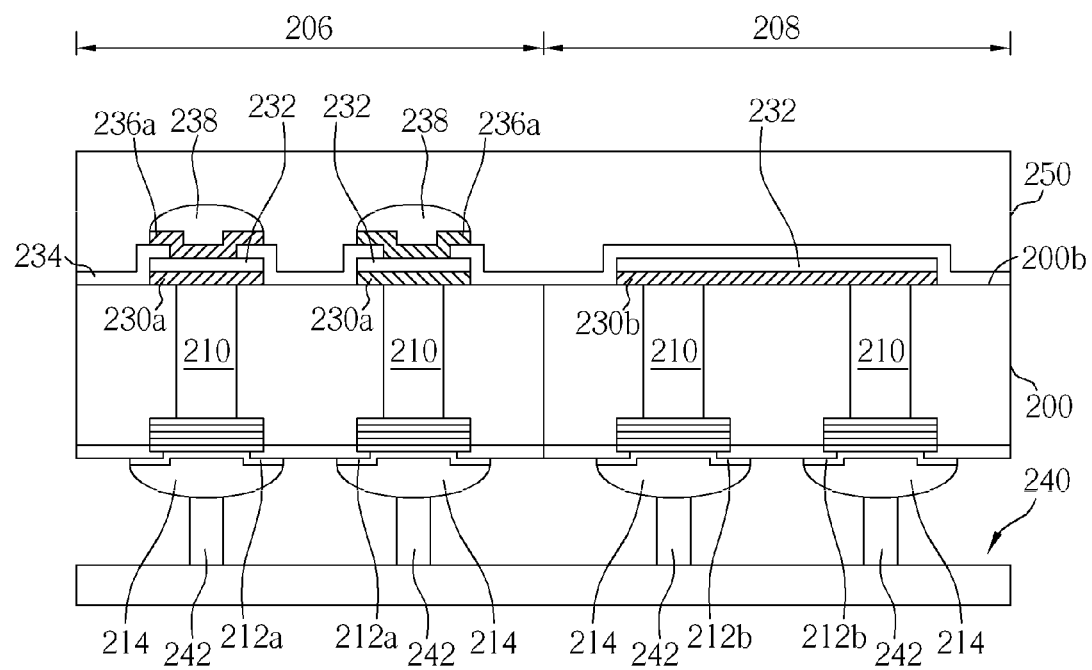

Please refer to FIGS. 9 and 10. After forming the tape 250, the first carrier wafer 220 is removed from the first side 200a of the wafer 200. Next, a probing card 240 is provided to the first side 200a of the wafer 200 to test the TSV structures 210. As shown in FIGS. 9 and 10, probing tips 242 of the probing card 240 contact with the bumps 214 for testing physical and electrical continuity of the TSV structures 210. Because the first pad 230b electrically connect all the TSV structures 210 in the non-functional region 208, the first pad 230b serves as a grounding layer for the testing, and thus the electrically continuity of the TSV structures 210 can be easily detected even no bumps are formed in the non-function region 208. In an approach that the TSV structures 210 formed in the non-function region 208 can simulate the TSV structures 210 formed in the function region 206, the physical and electrical continuity of the TSV structures 210 in the function region 206 are detected once the TSV structures 210 in the non-function region 208 are formed.

Additionally, though the preferred embodiment renders the first pads 230b as the patterned conductive layers for electrically connecting at least two of the TSV structures 210, the patterned conductive layers can be the UBM layers, the second pads 236b, the RDL 232, or the bumps 238.

According to the methods for testing TSV structures provided by the present invention, testing for physical and electrical continuity of the TSV structures is carried out by providing the probing card to the TSV structures. More important, the un-patterned first UBM layer or the patterned conductive layers formed on the back side of the wafer serves as a grounding layer during testing the TSV structures thus the electrical continuity between any two individual TSV structures is detected. More important, the test can be performed in advance to forming the bumps, even to patterning the UBM layer. In other words, discontinuity of the TSV structures is detected earlier than the conventional arts, and thus throughput, efficiency, and cost of the semiconductor fabrication process are all improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for testing through-silicon-via (TSV) structures, comprising:
   providing a wafer having a front side and a back side, the wafer further comprising a plurality of TSV structures formed therein;
   thinning the wafer from the back side of the wafer;
   forming a first under bump metallization (UBM) layer on the back side of the wafer blanketly;
   providing a probing card to the front side of the wafer to test the TSV structures after forming the first UBM layer; and
   patterning the first UBM layer after testing the TSV structures.

2. The method for testing TSV structures according to claim 1, wherein the first UBM layer is electrically connected to all of the TSV structures.

3. The method for testing TSV structures according to claim 1, further comprising forming a redistribution layer (RDL) before patterning the first UBM layer and forming a second UBM layer after patterning the first UBM layer.

4. The method for testing TSV structures according to claim 1, further comprising forming a plurality of bumps for each TSV structure on the back side of the wafer.

5. The method for testing TSV structures according to claim 4, further comprising forming a tape on the back side of the wafer after forming the bumps.

6. The method for testing TSV structures according to claim 1, further comprising forming a first carrier wafer on the front side of the wafer before thinning the wafer.

7. The method for testing TSV structures according to claim 6, further comprising removing the first carrier wafer before providing the probing card.

8. The method for testing TSV structures according to claim 7, further comprising forming a second carrier wafer on the back side of the wafer before removing the first carrier wafer.

9. The method for testing TSV structures according to claim 8, further comprising removing the second carrier wafer before patterning the first UBM layer.

10. The method for testing TSV structures according to claim 9, further comprising forming a third carrier wafer on the front side of the wafer before removing the second carrier wafer.

* * * * *